(12) United States Patent
Okabe et al.

(10) Patent No.: US 8,293,559 B2
(45) Date of Patent: Oct. 23, 2012

(54) METHOD OF MANUFACTURING PHOTOELECTRIC CONVERSION DEVICE

(75) Inventors: Takehito Okabe, Atsugi (JP); Hiroaki Naruse, Yokohama (JP); Ryuichi Mishima, Machida (JP); Kouhei Hashimoto, Ebina (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/161,959

(22) Filed: Jun. 16, 2011

(65) Prior Publication Data

US 2011/0244627 A1 Oct. 6, 2011

Related U.S. Application Data

(63) Continuation of application No. 12/792,844, filed on Jun. 3, 2010, now Pat. No. 7,993,951.

(30) Foreign Application Priority Data

Jun. 26, 2009 (JP) ................................. 2009-152873
Jun. 26, 2009 (JP) ................................. 2009-152875
May 19, 2010 (JP) ................................. 2010-115746

(51) Int. Cl.
*H01L 21/00* (2006.01)

(52) U.S. Cl. ................... 438/59; 438/597; 257/E31.052; 257/E31.095

(58) Field of Classification Search .................... 438/59, 438/597; 257/E31.052, E31.095
See application file for complete search history.

(56) References Cited

U.S. PATENT DOCUMENTS

| | | | | |
|---|---|---|---|---|
| 6,448,134 B2 * | 9/2002 | Kim | ............................... | 438/253 |
| 6,482,695 B1 * | 11/2002 | Kim | ............................... | 438/253 |
| 7,205,523 B2 | 4/2007 | Mishima et al. | ............ | 250/208.1 |
| 7,342,269 B1 | 3/2008 | Yuzurihara | .................... | 257/292 |
| 7,365,380 B2 | 4/2008 | Yuzurihara et al. | ........... | 257/292 |
| 7,417,273 B2 | 8/2008 | Inoue et al. | ................... | 257/292 |
| 7,749,788 B2 | 7/2010 | Okagawa et al. | ............... | 438/48 |
| 2007/0032022 A1 * | 2/2007 | Min et al. | ...................... | 438/275 |
| 2007/0205439 A1 | 9/2007 | Okita et al. | ................... | 257/228 |
| 2007/0252184 A1 | 11/2007 | Ohkawa | ......................... | 257/292 |
| 2008/0029793 A1 | 2/2008 | Watanabe et al. | ............. | 257/291 |
| 2008/0054388 A1 | 3/2008 | Nakata et al. | ................. | 257/432 |
| 2008/0157144 A1 | 7/2008 | Lee | .............................. | 257/292 |

(Continued)

FOREIGN PATENT DOCUMENTS

| | | | |
|---|---|---|---|
| JP | 2001-111022 A | | 4/2001 |
| JP | 2005-101442 A | | 4/2005 |

(Continued)

*Primary Examiner* — Alexander Ghyka
*Assistant Examiner* — Stanetta Isaac
(74) *Attorney, Agent, or Firm* — Fitzpatrick, Cella, Harper & Scinto

(57) ABSTRACT

In a method of manufacturing a photoelectric conversion device having a pixel region and a peripheral circuit region, a semiconductor compound layer is formed by causing a surface of a diffusion layer or gate electrode of a MOS transistor in the peripheral circuit region to react with a high melting point metal, then an insulating layer is formed in the pixel region and the peripheral circuit region after the step of forming a semiconductor compound layer. A contact hole is formed in the insulating layer to expose a diffusion layer in the pixel region, and a contact hole is formed in the insulating layer to expose the semiconductor compound layer formed in the peripheral circuit region. These holes are formed at different timings. Prior to forming the hole which is formed later, a contact plug is formed in the contact hole which is formed earlier.

27 Claims, 12 Drawing Sheets

| U.S. PATENT DOCUMENTS | | | | |
|---|---|---|---|---|
| 2008/0157153 A1 | 7/2008 | Yuzurihara et al. | | 257/292 |
| 2008/0203450 A1 | 8/2008 | Naruse et al. | | 257/290 |
| 2008/0203509 A1 | 8/2008 | Mishima et al. | | 257/432 |
| 2010/0173444 A1 | 7/2010 | Mishima et al. | | 438/60 |

| FOREIGN PATENT DOCUMENTS | | |
|---|---|---|
| JP | 2006-261411 A | 9/2006 |
| JP | 2007-294531 A | 11/2007 |

* cited by examiner

METHOD OF MANUFACTURING PHOTOELECTRIC CONVERSION DEVICE

CROSS REFERENCE TO RELATED APPLICATION

This application is a continuation of U.S. application Ser. No. 12/792,844 filed on Jun. 3, 2010, the entire disclosure of which is incorporated herein by reference.

BACKGROUND OF THE INVENTION

1. Field of the Invention

The present invention relates a method of manufacturing photoelectric conversion device, and more particularly to a technique of forming a contact hole in a process of manufacturing a photoelectric conversion device.

2. Description of the Related Art

In recent years, lower-cost digital cameras and digital video cameras with higher image qualities have prevailed thanks to advanced photoelectric conversion devices. Photoelectric conversion devices are classified into the CCD type, MOS type, and the like. A MOS photoelectric conversion device includes a pixel region and a peripheral circuit region. The pixel region includes a photoelectric conversion unit, a transfer transistor and an amplifying transistor. The peripheral circuit region includes a MOS transistor and processes a signal output from the pixel region and drives the photoelectric conversion device. The pixel region and peripheral circuit region can be manufactured in a common step by the CMOS manufacturing process.

The MOS transistor can operate quickly by adopting a salicide (to be referred to as a "silicide layer") structure in which a semiconductor compound of a high melting point metal is selectively formed on the source, drain, and gate electrode of the MOS transistor in the peripheral circuit region. However, the use of the silicide layer for the photoelectric conversion unit in the pixel region increases the leakage current of the photoelectric conversion unit, degrading the photoelectric conversion characteristic.

Japanese Patent Laid-Open No. 2001-111022 discloses an arrangement in which the salicide structure is used only in the peripheral circuit region to suppress the leakage current of the photoelectric conversion unit.

In some conventional active pixel solid-state image sensing devices typified by a CMOS image sensor, pixels have a global electronic shutter function to make the start times and end times of photo charge accumulation coincide with each other in a plurality of pixels arrayed in matrix.

To implement a solid-state image sensing device having the global electronic shutter function, the pixel region requires a photoelectric conversion unit which performs photoelectric conversion, and a charge holding unit which holds charges generated in the photoelectric conversion unit for a certain period. The charge holding unit holds charges till reading after the end of accumulation in a given pixel. If light enters the charge holding unit and charges are generated by photoelectric conversion at the P-N junction adjacent to the charge holding unit, the charges act as light leakage noise, degrading the image quality.

To solve this problem, Japanese Patent Laid-Open No. 2007-294531 discloses an arrangement in which a light-shielding film is formed to shield the charge holding unit from light without shielding the photoelectric conversion unit from light. The light-shielding film prevents light from entering the charge holding unit, thereby suppressing degradation of the image quality.

SUMMARY OF THE INVENTION

In Japanese Patent Laid-Open No. 2001-111022, a pixel region having no silicide layer and a peripheral circuit region having a silicide layer are formed. Then, an insulating layer and contact holes are formed. At this time, the inventors have found that the following problem arises in etching for forming contact holes in the pixel region and peripheral circuit region. Specifically, there is a possibility that a high melting point metal scatters from the silicide layer at the bottom of the peripheral circuit region, and contaminates the inside of the contact hole and the photodiode in the pixel region. The contamination of the inside of the contact hole and the photodiode in the pixel region increases the leakage current in the pixel region, resulting in a poor photoelectric conversion characteristic.

The light-shielding film which shields the charge holding unit from light is generally formed using a metal film of tungsten, tungsten silicide, or the like in terms of the light reflection characteristic. The light-shielding film is formed from such a metal film to shield the charge holding unit from light. Subsequently, an interlayer dielectric film is formed. Then, etching is done to form contact holes on the light-shielding film, a diffusion layer, and a gate electrode. Conventionally, these contact holes are formed in the same step. In etching, the metal scatters from the light-shielding film made of the metal film. The metal may contaminate the inside of the contact hole on the diffusion layer and further contaminate the photodiode. If the photodiode is contaminated with the metal, for example, the leakage current increases, degrading the image quality.

The present invention has been made in consideration of the above situation, and reduces contamination of a photoelectric conversion unit with a metal or high melting point metal when forming a contact hole in a photoelectric conversion device.

According to the present invention, provided is a method of manufacturing a photoelectric conversion device having a pixel region and a peripheral circuit region, the method comprising: a step of forming a semiconductor compound layer by causing a surface of a diffusion layer or gate electrode of a MOS transistor in the peripheral circuit region to react with a high melting point metal; a step of forming an insulating layer in the pixel region and the peripheral circuit region after the step of forming a semiconductor compound layer; a first contact hole formation step of forming a contact hole in the insulating layer to expose a diffusion layer in the pixel region; a second contact hole formation step of forming a contact hole in the insulating layer to expose the semiconductor compound layer formed in the peripheral circuit region, the second contact hole formation step being executed at a timing different from a timing of the first contact hole formation step; and a step of forming, prior to a step executed later out of the first contact hole formation step and the second contact hole formation step, a contact plug in the contact hole formed in a step executed first.

Further, according to the present invention, provided is a method of manufacturing a photoelectric conversion device including a pixel having a photoelectric conversion unit, a charge holding unit which holds charges converted by the photoelectric conversion unit, and a MOS transistor for reading out the charges, the method comprising: a step of forming a light-shielding film which shields the charge holding unit from light without shielding the photoelectric conversion unit from light; a step of forming an insulating layer to cover the pixel after the step of forming a light-shielding film; a first contact hole formation step of forming contact holes in the insulating layer to expose surfaces of a diffusion layer and gate electrode of the MOS transistor of the pixel; a second contact hole formation step of forming a contact hole in the insulating layer to expose the light-shielding film, the second contact hole formation step being executed at a timing different from a timing of the first contact hole formation step; and a step of forming, prior to a step executed later out of the first contact hole formation step and the second contact hole formation step, a contact plug in the contact hole formed in a step executed first.

Furthermore, according to the present invention, provided is a method of manufacturing a photoelectric conversion device having a photoelectric conversion unit and a plurality of MOS transistors for reading out charges converted by the photoelectric conversion unit, the method comprising: a step of forming a semiconductor compound layer by causing surfaces of diffusion layers or gate electrodes of some MOS transistors of the plurality of MOS transistors to react with a high melting point metal to form semiconductor compound layers on the some MOS transistors; a step of forming an insulating layer to cover the photoelectric conversion unit and the plurality of MOS transistors after the step of forming a semiconductor compound layer; a first contact hole formation step of forming contact holes in the insulating layer to expose diffusion layers or gate electrodes of MOS transistors having no semiconductor compound layer out of the plurality of MOS transistors; a second contact hole formation step of forming contact holes in the insulating layer to expose the semiconductor compound layers of the some MOS transistors, the second contact hole formation step being executed at a timing different from a timing of the first contact hole formation step; and a step of forming, prior to a step executed later out of the first contact hole formation step and the second contact hole formation step, contact plugs in the contact holes formed in a step executed first.

Further features of the present invention will become apparent from the following description of exemplary embodiments (with reference to the attached drawings).

DESCRIPTION OF THE EMBODIMENTS

Preferred embodiments of the present invention will be described in detail in accordance with the accompanying drawings.

First Embodiment

FIGS. 1A to 1J are sectional views of the pixel region and peripheral circuit region of a photoelectric conversion device for explaining a method of manufacturing a photoelectric conversion device according to the first embodiment of the present invention. The first embodiment is directed to a structure in which the peripheral circuit region has a high melting point metal compound layer (silicide layer). The first embodiment will describe a CMOS photoelectric conversion device, but the type of photoelectric conversion device is not limited to this.

Figure 1A:
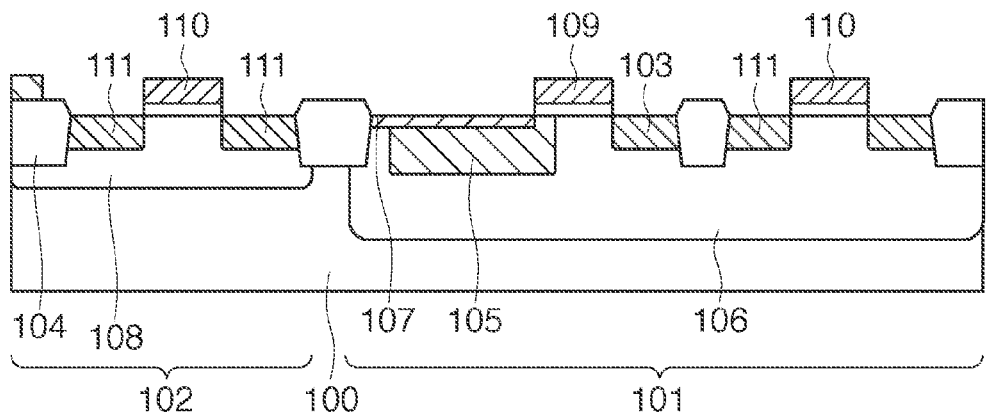
FIGS. 1A to 1J are sectional views for explaining a method of manufacturing a photoelectric conversion device according to a first embodiment.

In FIG. 1A, a plurality of pixels are arranged in a pixel region 101. Each pixel includes the charge accumulation region of a photodiode serving as a photoelectric conversion unit, and a MOS transistor for transferring charges generated in the photoelectric conversion unit. A peripheral circuit region 102 includes a MOS transistor, and processes a signal output from the pixel region 101 and drives to read out a signal from the pixel region. FIG. 1A shows a part of the pixel region 101 and a part of the peripheral circuit region 102. As for the pixel region 101, a part of one pixel is illustrated, and as for the peripheral circuit region 102, one MOS transistor is illustrated in FIG. 1A. The pixel region and peripheral circuit region can be manufactured in a single semiconductor substrate in a common step by the CMOS manufacturing process. In the embodiment, the charge is electrons.

A semiconductor substrate 100 is, for example, a single crystal silicon substrate including an n-type semiconductor region. Reference numeral 104 denotes an element isolation; 106, a pixel region well; 105, a charge accumulation region of the photodiode that is formed from an n-type semiconductor. Reference numeral 109 denotes a gate electrode of a transfer MOS transistor in the pixel region 101; 107, a p-type semiconductor layer of the photodiode on the surface of the photodiode. Reference numerals 110 denote gate electrodes of MOS transistors in the pixel region 101 and peripheral circuit region 102. The pixel region well 106 is optimized appropriately in accordance with the photodiode characteristics, so the junction depth, the impurity concentration, and the like are arbitrarily set. The semiconductor substrate 100 may be a substrate of another type or an epitaxial layer formed on a substrate, instead of the single crystal silicon substrate.

An n-type semiconductor layer (floating diffusion layer) 103 holds electrons transferred from the charge accumulation region 105. The n-type semiconductor layer 103 forms the transfer MOS transistor together with the charge accumulation region 105 and gate electrode 109. Reference numerals 111 denote source/drain regions of an n-type MOS transistor formed in the pixel region 101, and source/drain regions of an n-type MOS transistor formed in the peripheral circuit region 102. Reference numeral 108 denotes a p-well region in the peripheral circuit region 102. Note that the peripheral circuit region 102 may have an n-well region where a p-type MOS transistor can be arranged, in addition to the p-well region. MOS transistors formed in the pixel region 101 are, for example, a transfer MOS transistor for transferring charges, and an amplification MOS transistor for amplifying and outputting charges. MOS transistors formed in the peripheral circuit region 102 are those which form a driving circuit for driving MOS transistors in the pixel region 101, and a signal processing circuit for processing a signal.

Figure 1B:
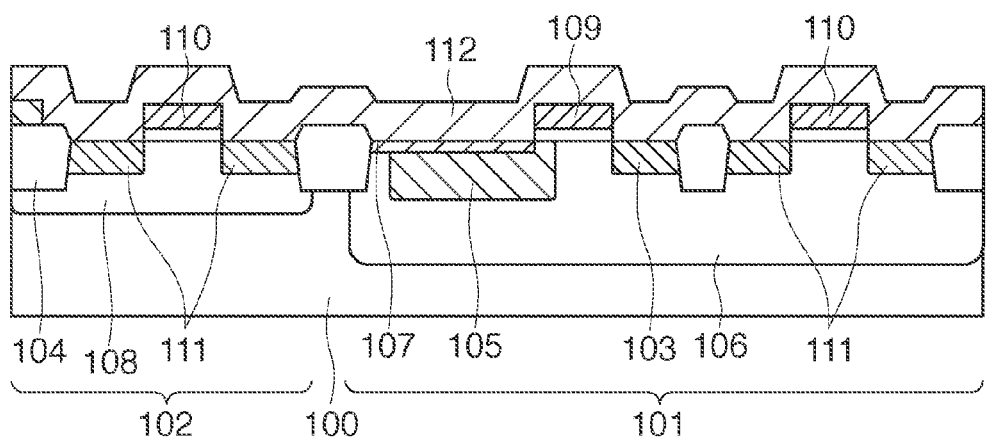
Figure 1C:
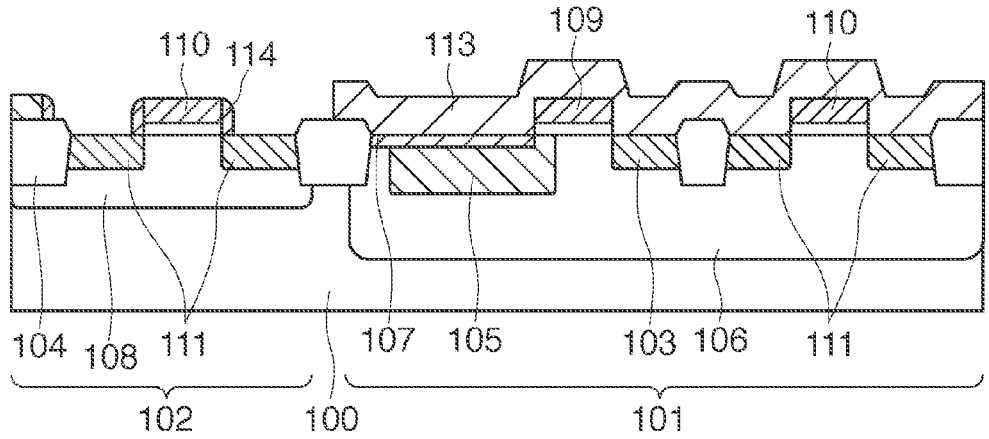

As shown in FIG. 1B, an insulating film layer 112 is formed from one or a combination of a silicon nitride film, silicon oxide film, and silicon oxynitride film. As shown in FIG. 1C, the insulating film layer 112 is removed mainly from the peripheral circuit region 102 by photolithography and dry etching, forming an insulating film layer 113 in the pixel region. At this time, in the peripheral circuit region 102, the insulating film layer 112 remains on the gate side walls of the MOS transistor and serves as side spacers 114 for the LDD structure.

Figure 1D:
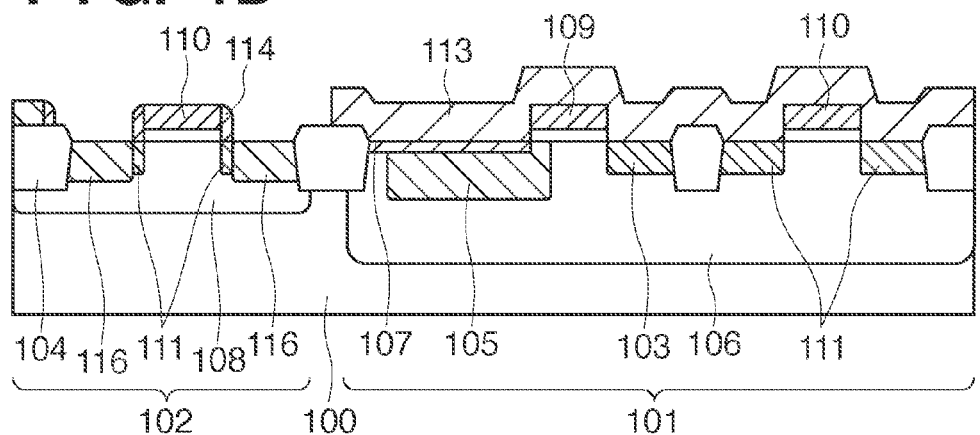

After that, as shown in FIG. 1D, heavily doped n-type semiconductor regions 116 (diffusion layers) are formed in the source/drain regions of the MOS transistor in the peripheral circuit region 102, forming a MOS transistor having the LDD structure. In the first embodiment, the n-type semiconductor regions 116 are not formed in the source/drain regions of the MOS transistor in the pixel region 101 because of the presence of the insulating film layer 113.

Figure 1E:
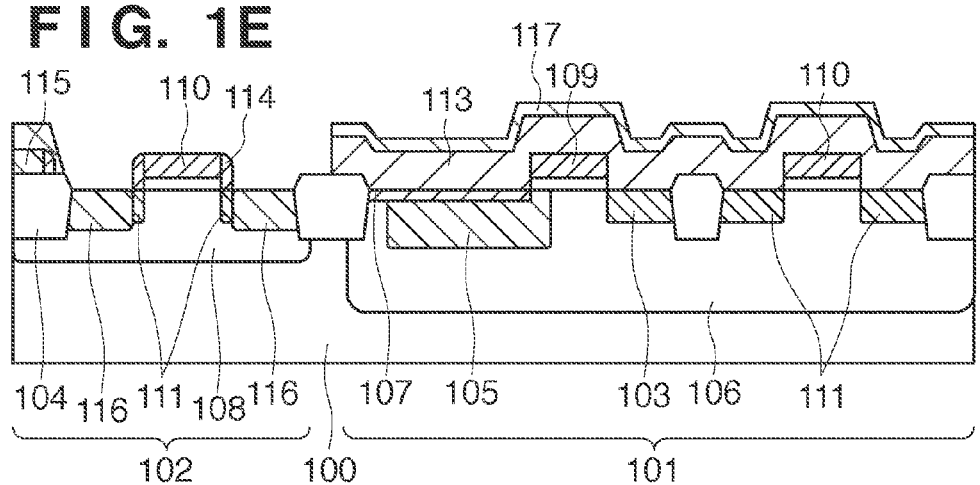

Next, an insulating film such as a silicon nitride film, silicon oxide film, or silicon oxynitride film is first formed by CVD, PVD or the like. Then, as shown in FIG. 1E, the insulating film is selectively removed from the peripheral circuit region 102 while leaving it only in the pixel region 101, thereby forming a semiconductor compound blocking layer 117 of a high melting point metal. At this time, the semiconductor compound blocking layer 117 may be left in a part of the peripheral circuit region 102 to form a high-resistance region 115. The high-resistance region 115 is a resistance element. In this region, it is desirable not to form a silicide layer because the formation of the silicide layer decreases the resistance.

Figure 1F:
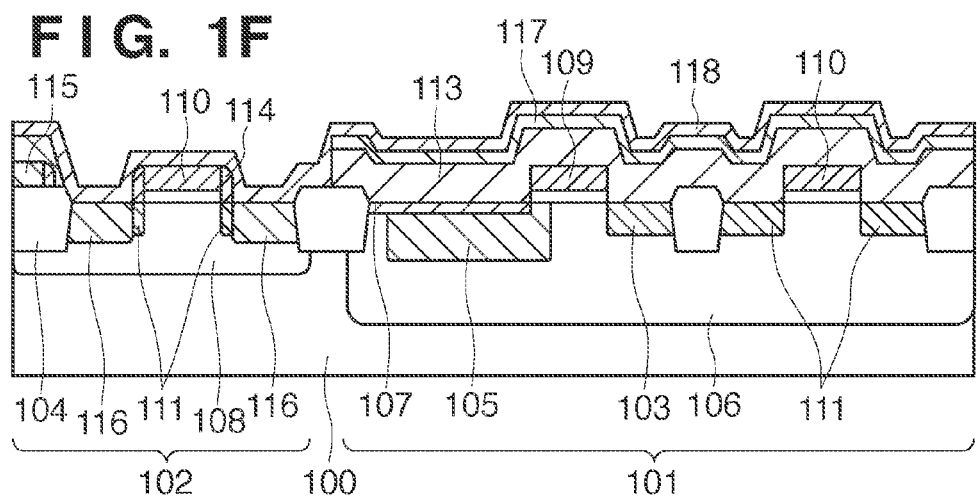

As shown in FIG. 1F, a multilayered film 118 of cobalt serving as a high melting point metal and titanium nitride serving as an antioxidant film for the high melting point metal is deposited by CVD, sputtering, or the like. Examples of the high melting point metal are titanium, nickel, tungsten, molybdenum, tantalum, chrome, palladium, and platinum, in addition to cobalt. Other materials of the antioxidant film for the high melting point metal are nickel and titanium, in addition to titanium nitride.

Figure 1G:
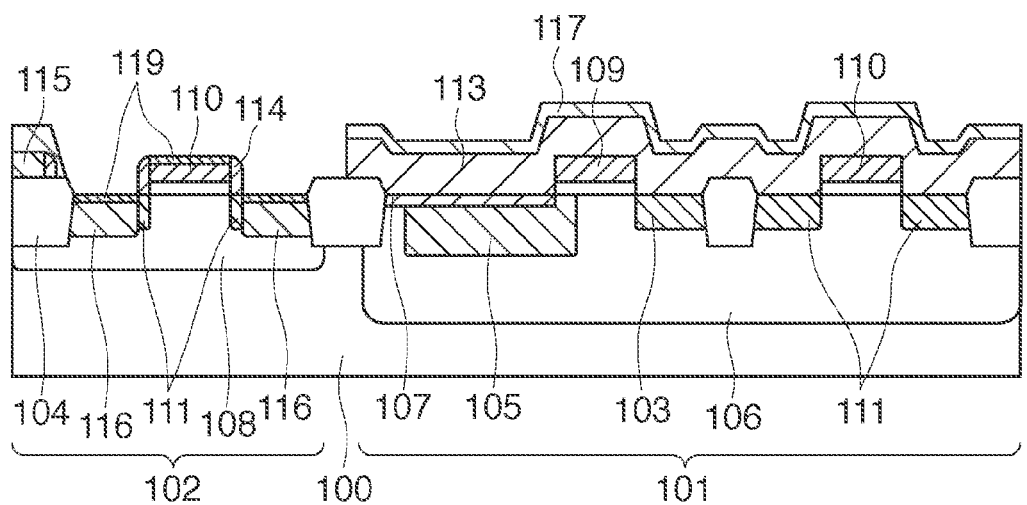

In FIG. 1G, the multilayered film 118 serving as the high melting point metal film is annealed to cause the high melting point metal, to react with silicon which forms the gate electrode, source, and drain of the MOS transistor in the peripheral circuit region 102 (silicidation). As a result, the silicide layer of the high melting point metal (semiconductor compound layer of the high melting point metal) is formed on the source, drain, and gate electrode of the MOS transistor in the peripheral circuit region 102. Examples of the semiconductor compound of the high melting point metal are titanium silicide, nickel silicide, cobalt silicide, tungsten silicide, molybdenum silicide, tantalum silicide, chrome silicide, palladium silicide, and platinum silicide. At this time, in the region where the semiconductor compound blocking layer 117 described with reference to FIG. 1E is arranged, this layer acts as a silicidation blocking layer and no high melting point metal silicide layer is formed. Similarly, no high melting point metal silicide layer is formed in the high-resistance region 115. Thereafter, the multilayered film 118 containing an unreacted high melting point metal is removed by dipping it into an acid solution. Accordingly, silicide layers 119 can be formed at desired portions in the peripheral circuit region 102, as shown in FIG. 1G.

Figure 1H:
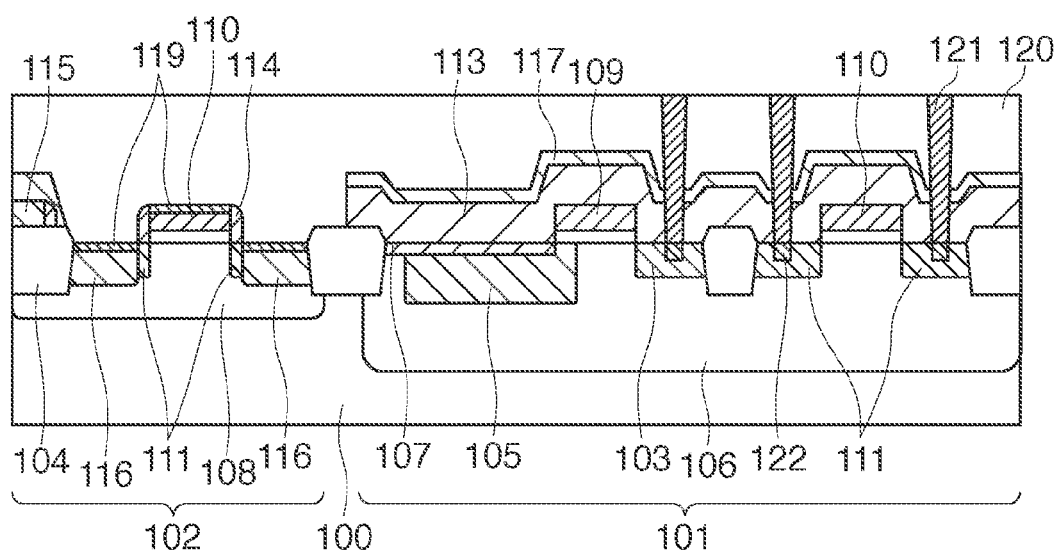

As shown in FIG. 1H, an insulating layer 120 is formed from a silicon oxide film or a boron- or phosphorous-containing silicon oxide film, for example. The insulating layer 120 functions as an interlayer dielectric film. In only the unsilicidized pixel region 101, contact holes are formed in the insulating layer 120 using photolithography and etching. A single- or multi-layered metal film is deposited by CVD or the like, and an unnecessary metal film is removed by CMP or the like, forming contact plugs 121. Before forming the contact plugs 121, an impurity may be doped (ion implantation) into the well via a desired contact hole to form an impurity region 122, which can stabilize the contact resistance. After forming the contact holes, their insides may be cleaned with an acid or alkali solution such as hydrofluoric acid or ammonia hydrogen peroxide mixture before forming the contact plugs 121. The insides of the contact holes are preferably cleaned after doping an impurity into the contact holes. This realizes to reduce contamination of a semi-conductor substrate with metal or high melting point metal.

Figure 1I:
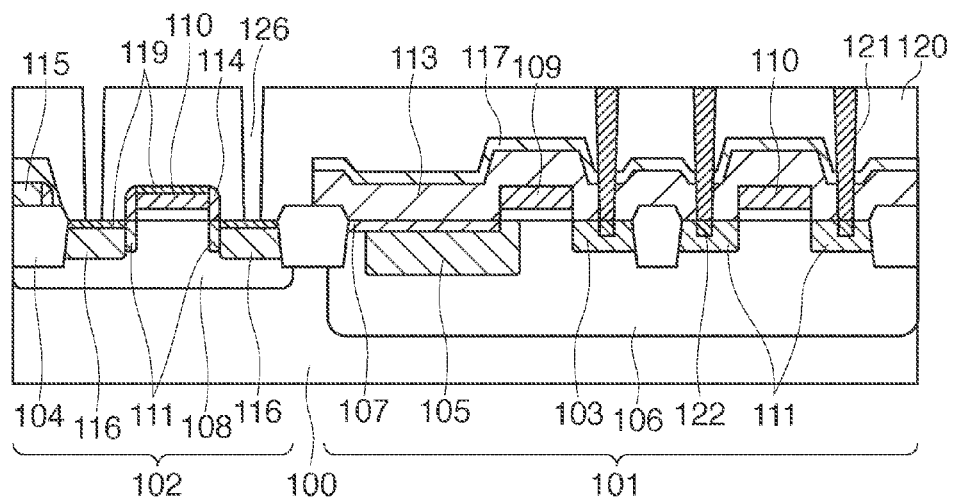
Figure 1J:
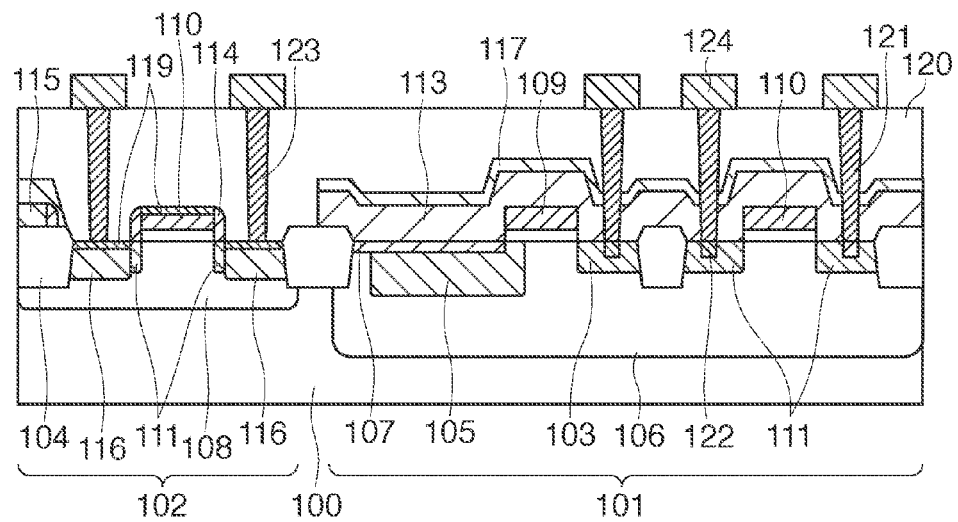

As shown in FIG. 1I, after the contact plugs 121 are formed in the pixel region 101, contact holes 126 are formed in the insulating layer 120 in the peripheral circuit region 102 similarly using photolithography and etching. As shown in FIG. 1J, contact plugs 123 are formed by the same method as that in the pixel region 101. Finally, a wiring layer 124 is formed from a metal such as aluminum or copper in the pixel region and the peripheral circuit region. After that, an insulating layer, via plug, and wiring layer may also be formed. A color filter and microlens are formed, completing a photoelectric conversion device (not shown).

In the manufacturing method described with reference to FIGS. 1A to 1J, if the silicide layer is formed in the peripheral circuit region, the step of forming contact holes in the pixel region, and the step of forming contact holes in the peripheral circuit region are executed at different timings as different steps. When forming contact holes in the peripheral circuit region, contact holes in the pixel region can be filled with contact plugs. This can prevent contamination of the pixel region with a metal scattering from the silicide layer in the peripheral circuit region. Hence, the photoelectric conversion device can be manufactured without degrading the pixel characteristics.

In the manufacturing method of the embodiment, no silicide layer is exposed when forming contact holes in the pixel region. Thus, the bottoms of the contact holes in the pixel region can be cleaned, obtaining a sufficient contact resistance. In the peripheral region, that is, the contact hole through which the silicide layer is exposed, a contact plug can be connected satisfactorily, so no impurity need be doped. It is preferable not to clean the inside of the contact hole through which the silicide layer is exposed, in order to suppress damage to the silicide layer.

In the above-described first embodiment, contact holes are formed first in the pixel region 101. Alternatively, contact holes may be formed first in the peripheral circuit region 102. In this case, the same effects as those described above can be obtained by forming contact plugs in the contact holes in the peripheral circuit region 102 prior to forming contact holes in the pixel region 101.

Second Embodiment

A method of manufacturing a photoelectric conversion device in the second embodiment will be explained with reference to FIGS. 1G, 1J, and 2A to 2C. In the manufacturing method of the second embodiment, contact holes are formed in a pixel region 101, and then contact holes are formed in a peripheral circuit region 102 without forming contact plugs.

A description of the same structure and manufacturing steps as those in the first embodiment will not be repeated.

Figure 2A:
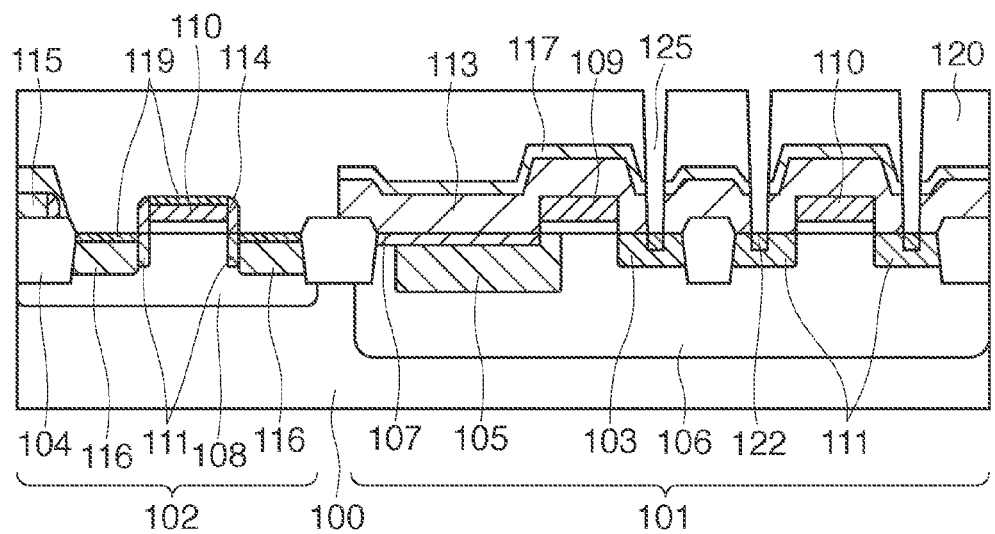
FIGS. 2A to 2C are sectional views for explaining a method of manufacturing a photoelectric conversion device according to a second embodiment.

The second embodiment is characterized by processing after silicidizing silicon which forms the gate electrode and source/drain regions of a MOS transistor in the peripheral circuit region 102 in FIG. 1G. After FIG. 1G, for example, an insulating layer 120 is formed from a silicon oxide film or a boron- or phosphorous-containing silicon oxide film, as shown in FIG. 2A. In only the unsilicidized pixel region 101, contact holes 125 are formed. At this time, before forming contact plugs, an impurity may be doped into a desired contact hole 125 to form an impurity region 122, similar to the first embodiment. After forming the contact holes 125 in the pixel region 101, their bottoms may be cleaned with an acid or alkali solution such as hydrofluoric acid or ammonia hydrogen peroxide mixture.

Figure 2B:
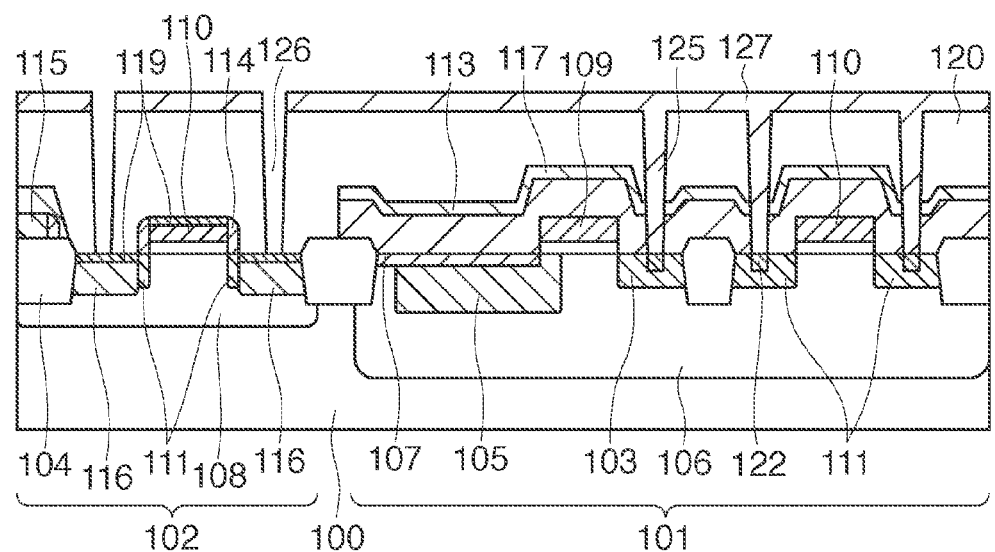
Figure 2C:
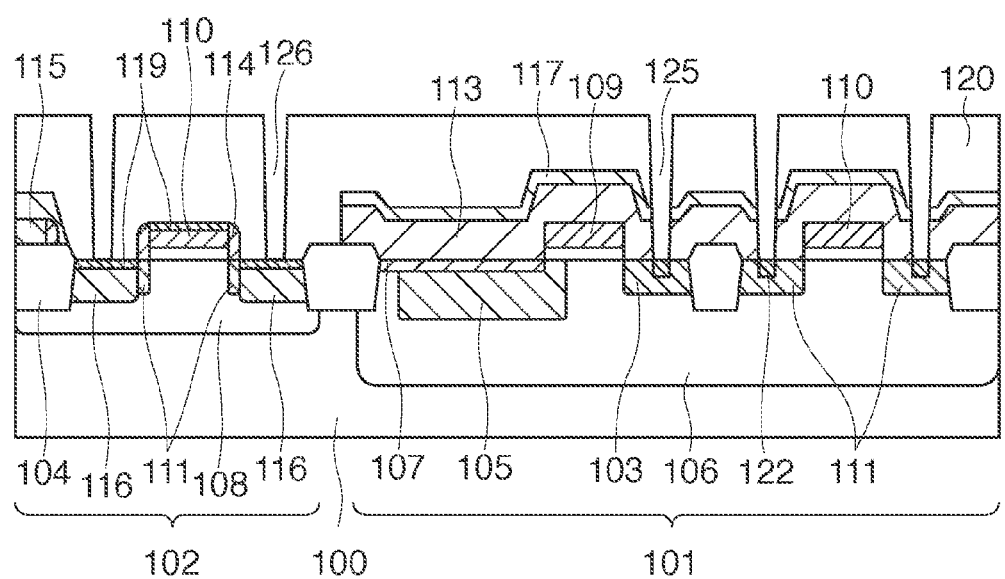

As shown in FIG. 2B, contact holes 126 are formed in the insulating layer 120 in the peripheral circuit region 102 using a photoresist 127 (photoresist pattern) as a mask. Then, as shown in FIG. 2C, the photoresist pattern is removed. Finally, a metal film is deposited by CVD or the like, contact plugs 121 and 123 are formed by CMP or the like, and a wiring layer 124 is formed from a metal such as aluminum or copper (FIG. 1J).

As described above, the second embodiment can shorten the process because contact plugs are formed at once after forming contact holes in the pixel region 101 and peripheral circuit region 102. In the second embodiment, when forming the contact holes 126 in the peripheral circuit region, the contact holes 125 in the pixel region are filled by applying a mask material such as a photoresist. This can prevent contamination of the pixel region with a high melting point metal from the silicide layer. A dark current and point defects can therefore be reduced.

In the second embodiment described above, contact holes are formed first in the pixel region 101. Alternatively, contact holes may be formed first in the peripheral circuit region 102. In this case, the same effects as those described above can be obtained by filling contact holes in the peripheral circuit region 102 with a photoresist prior to forming contact holes in the pixel region 101.

The present invention is not limited to the first and second embodiments. For example, the semiconductor compound blocking layer 117 is used in the first and second embodiments. Instead, the insulating film layer 112 may be left in an arbitrary location, for example, the high-resistance region in the peripheral circuit region 102 without using the semiconductor compound blocking layer 117. That is, the insulating film layer 112 is also usable as the semiconductor compound blocking layer which blocks formation of a silicide layer.

Third Embodiment

Figure 3:
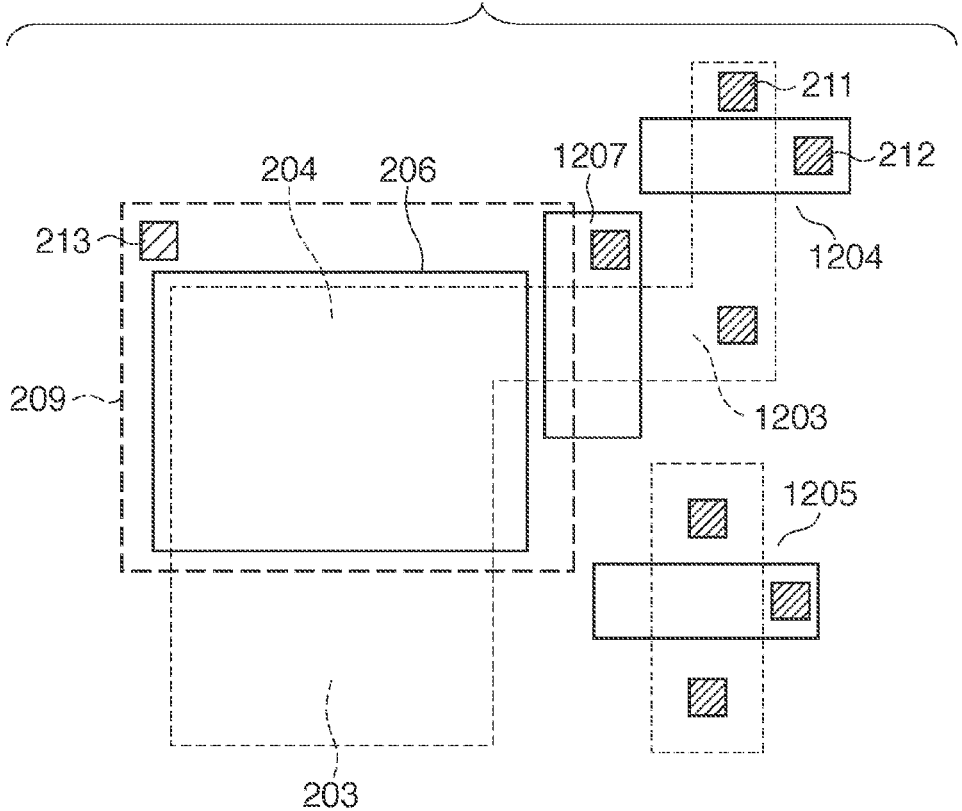
FIG. 3 is a schematic view showing the two-dimensional layout of a pixel unit of a photoelectric conversion device according to third and fourth embodiments.

The third embodiment is directed to a CMOS photoelectric conversion device having an electronic shutter function, that is, having a charge holding unit. FIG. 3 is a schematic view showing the two-dimensional layout of the unit pixel of a photoelectric conversion device in the third embodiment. In FIG. 3, a charge holding unit 204 holds charges converted by a photoelectric conversion unit 203 for a certain period. A control electrode 206 is arranged on the charge holding unit 204 and controls the potential of the charge holding unit 204. The control electrode 206 can control charge transfer from the photoelectric conversion unit 203 to the charge holding unit 204. Reference numeral 1207 denotes a gate electrode of a transfer MOS transistor which transfers charges from the charge holding unit 204 to a floating diffusion unit 1203. A reset MOS transistor 1204 initializes the voltage of the floating diffusion unit 1203. An amplification MOS transistor 1205 forms a source follower circuit for reading out the voltage of the floating diffusion unit 1203. These constituent elements are formed on a semiconductor substrate.

A light-shielding film 209 is formed to have an opening above the photoelectric conversion unit 203 and shield the upper portion of the charge holding unit 204 from light. The material of the light-shielding film 209 is a metal or metal silicide such as tungsten or tungsten silicide. Contact plugs for connecting to a wiring layer (not shown) are arranged on an insulating layer. The insulating layer is formed on the foregoing elements and serves as an interlayer dielectric layer. And the wiring layer is arranged on the insulating layer. In the following description, attention will be paid to a light-shielding film contact plug 213, gate electrode contact plug 212, and diffusion layer contact plug 211. The diffusion layers are impurity regions including the source/drain regions of a MOS transistor and a well contact region for supplying the potentials of the semiconductor substrate and well. The gate electrode contact plugs include even contacts on a wiring layer, resistance element, and the like formed in the same step (same layer) as that of the gate electrode. It should be noted that a contact to the control electrode 206 is not shown.

Figure 4:
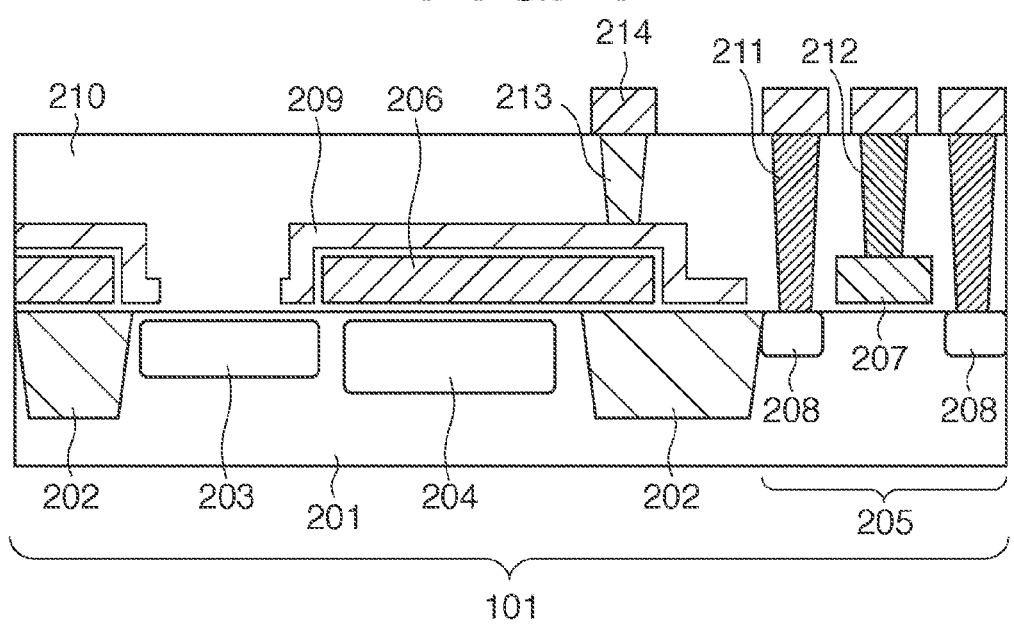
FIG. 4 is a sectional view showing the photoelectric conversion device according to the third and fourth embodiments.

FIG. 4 is a sectional view showing the structure of the photoelectric conversion device in the third embodiment. FIG. 4 shows part of a pixel region 101 including a plurality of pixels of the photoelectric conversion device. Part of one pixel is illustrated. A charge accumulation region where charges in the photoelectric conversion unit 203 for performing photoelectric conversion are accumulated, and the charge holding unit 204 are formed in a silicon semiconductor substrate 201. Further, MOS transistor 205 is also formed in the silicon semiconductor substrate in a region isolated by element isolations 202. The MOS transistor 205 is, for example, the reset MOS transistor 1204. The MOS transistor 205 includes a gate electrode 207 and source/drain regions 208.

The control electrode 206 is arranged on the charge holding unit 204. The light-shielding film 209 is formed to have an opening above the photoelectric conversion unit 203 and cover the charge holding unit 204. An insulating layer 210 is arranged to cover the light-shielding film 209, the gate electrode 207, and the diffusion layer including the source/drain regions 208. A wiring layer 214 is arranged on the insulating layer 210. The light-shielding film contact plug 213 is formed as a contact plug for connecting the wiring layer 214 and light-shielding film 209. The gate electrode contact plug 212 and diffusion layer contact plug 211 are formed as contacts for connecting the wiring layer 214 and gate electrode 207, and connecting the wiring layer 214 and the diffusion layer including the source/drain regions 208, respectively. FIG. 4 does not illustrate an insulating layer, via plug, wiring layer, color filter, microlens, and the like which are arranged on the wiring layer 214.

A method of manufacturing a photoelectric conversion device having the above structure in the third embodiment will be described with reference to FIGS. 5A to 5F.

Figure 5A:
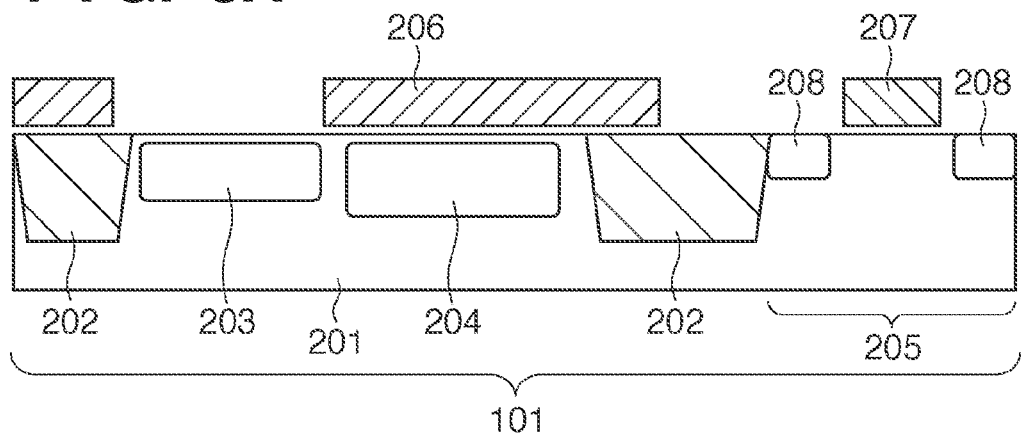
FIGS. 5A to 5F are sectional views showing a method of manufacturing a photoelectric conversion device according to the third embodiment.

Referring to FIG. 5A, element isolations 202 are formed in a semiconductor substrate 201 by a conventional STI or LOCOS technique. A photoelectric conversion unit 203, charge holding unit 204, peripheral circuit well (not shown), and the like are sequentially formed by impurity doping. Then, a control electrode 206 for controlling the potential of the charge holding unit 204, and a gate electrode 207 of a MOS transistor are formed using photolithography and etching. Source/drain regions 208 of the MOS transistor are formed by impurity doping. At this time, the source/drain regions 208 may be formed after forming side walls to improve the transistor performance. As for the photoelectric conversion unit 203, it is also possible to form the control electrode 206 and then dope an impurity into the photoelectric conversion unit 203 in self-alignment using the control electrode 206.

Figure 5B:
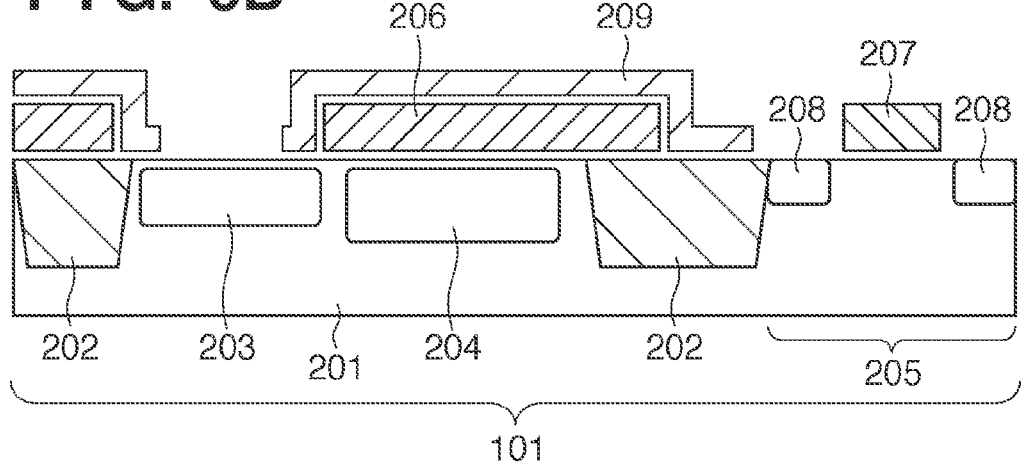

As shown in FIG. 5B, a light-shielding film 209 is formed to have an opening corresponding to the photoelectric conversion unit 203 and shield the charge holding unit 204 from light. First, an insulating layer of silicon oxide film, or the like, is formed on the control electrode 206. Then, a metal film or metal silicide film of tungsten, tungsten silicide, or the like is deposited by CVD or sputtering. Then, the deposited film is shaped into a desired pattern by photolithography and etching, thereby forming the light-shielding film 209.

Figure 5C:
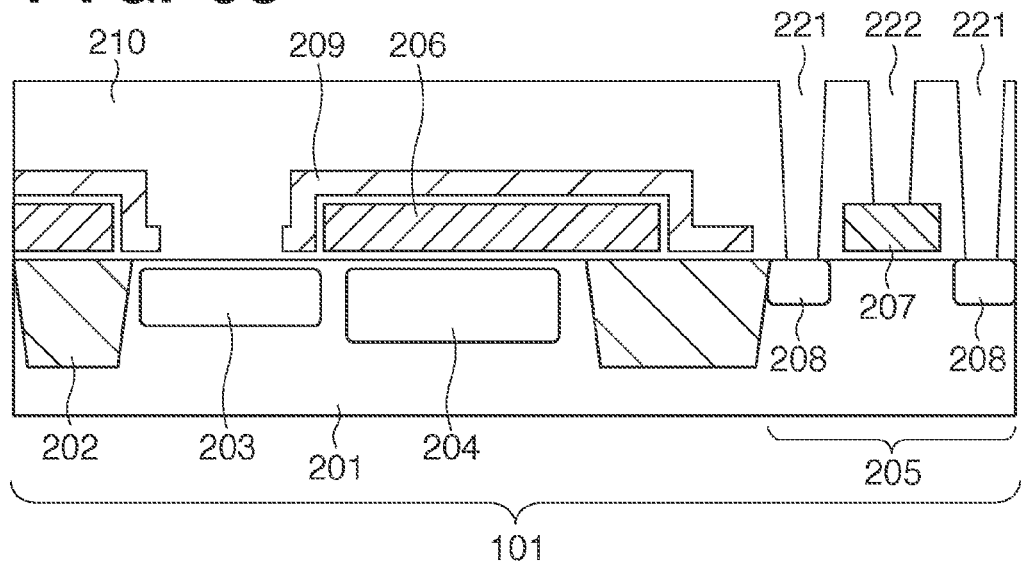

As shown in FIG. 5C, an insulating layer 210 is formed from a silicon oxide film or a boron- or phosphorous-containing silicon oxide film, and contact holes are formed. First, only a gate electrode contact hole 222 and diffusion layer contact holes 221 are formed by photolithography and etching in a region except for the light-shielding film 209 formed from the metal film. Accordingly, parts of the gate electrode 207 and source/drain regions 208 serving as a diffusion layer are partially exposed.

Figure 5D:
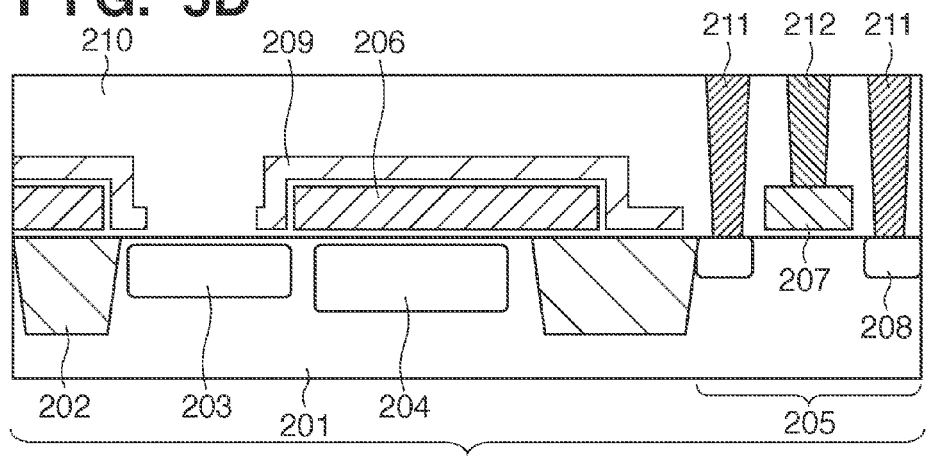

Then, as shown in FIG. 5D, a single- or multi-layered metal film is deposited by CVD or the like, and an unnecessary metal film is removed by CMP or the like, forming a gate electrode contact plug 212 and diffusion layer contact plugs 211. Before forming the contact plugs, an impurity may be doped into a desired contact hole to form an impurity region (not shown), which can stabilize the contact resistance. After forming the contact holes, their insides may be cleaned with an acid or alkali solution such as hydrofluoric acid or ammonia hydrogen peroxide mixture before forming contact plugs.

Figure 5E:
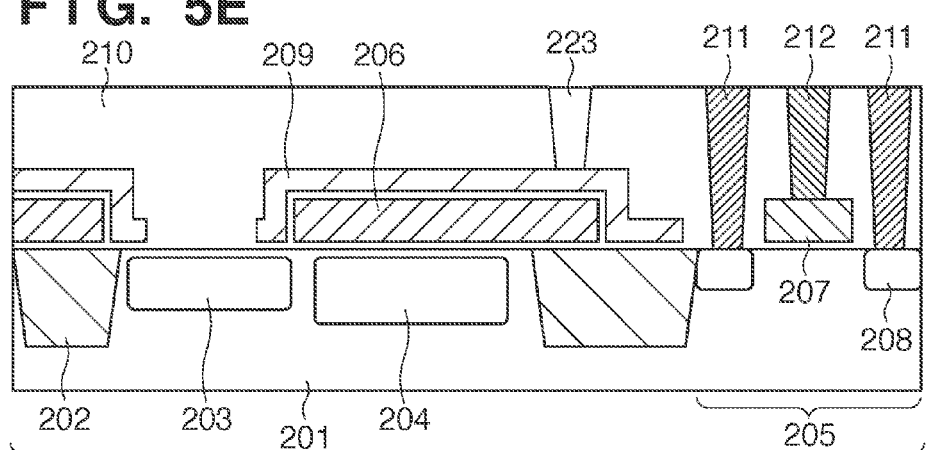
Figure 5F:
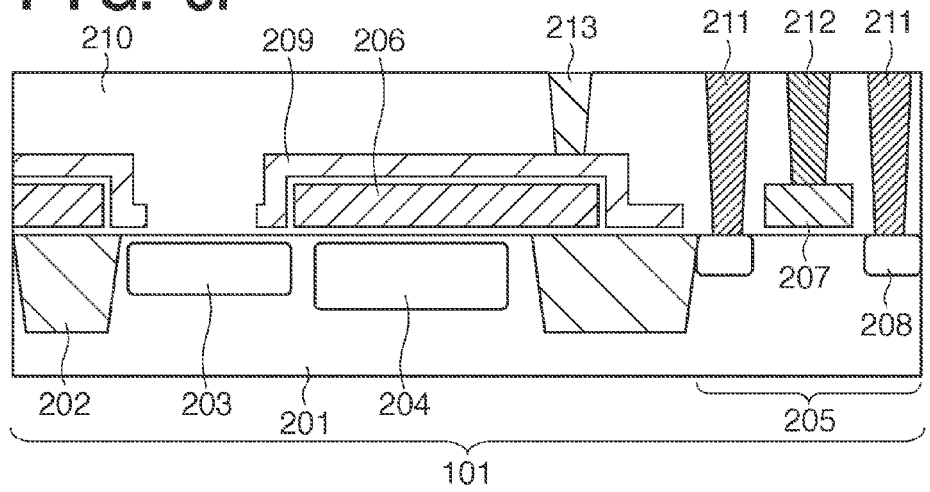

Thereafter, a light-shielding film contact hole 223 is formed in the insulating layer by photolithography and etching (FIG. 5E). A light-shielding film contact plug 213 is formed by the same method as that of the gate electrode contact plug 212 and diffusion layer contact plugs 211 (FIG. 5F). Finally, a wiring layer 214 is formed from a metal such as aluminum or copper (FIG. 4).

As described above, the step of forming a contact hole in the light-shielding film, and the step of forming contact holes in a region except for the light-shielding film are different and executed at different timings after forming a metal film (or metal silicide film) as a light-shielding film in the pixel region. Further, the step of forming contact holes in a region except for the light-shielding film and forming contact plugs is performed first. The contact holes in a region except for the light-shielding film can be filled when forming a contact hole on the light-shielding film. This can prevent contamination of the photodiode with a metal scattering from the metal film (or metal silicide film). The photoelectric conversion device can be manufactured without degrading the pixel characteristics.

When forming contact holes in a region except for the light-shielding film, no metal film (or metal silicide film) is exposed. Hence, the insides of the contact holes can be cleaned with a solution, ensuring a sufficient contact resistance without damaging the light-shielding film. In the light-shielding film contact hole through which the light-shielding film is exposed, a contact plug can be connected satisfactorily, so no impurity need be doped. It is preferable not to clean the inside of the light-shielding film contact hole in order to suppress damage to the light-shielding film.

In the third embodiment, the gate electrode contact hole 222 and diffusion layer contact holes 221 of the MOS transistor 205 are formed first. However, the light-shielding film contact hole 223 may be formed first. In this case, the same effects as those described above can be obtained by forming the light-shielding film contact plug 213 prior to forming the gate electrode contact hole 222 and diffusion layer contact holes 221.

Fourth Embodiment

A method of manufacturing a photoelectric conversion device in the fourth embodiment will be explained with reference to FIGS. 6A and 6B. The method of manufacturing a photoelectric conversion device in the fourth embodiment concerns a method of manufacturing a photoelectric conversion device having a charge holding unit, similar to the third embodiment. The fourth embodiment will describe a manufacturing method of forming only a gate electrode contact hole 222 and diffusion layer contact holes 221 by etching, and then forming a light-shielding film contact hole 223 without forming contact plugs. A description of the same structure and manufacturing steps as those in the third embodiment will not be repeated.

In the fourth embodiment, steps up to one shown in FIG. 5C are the same as those in the third embodiment, and a description thereof will not be repeated.

Figure 6A:
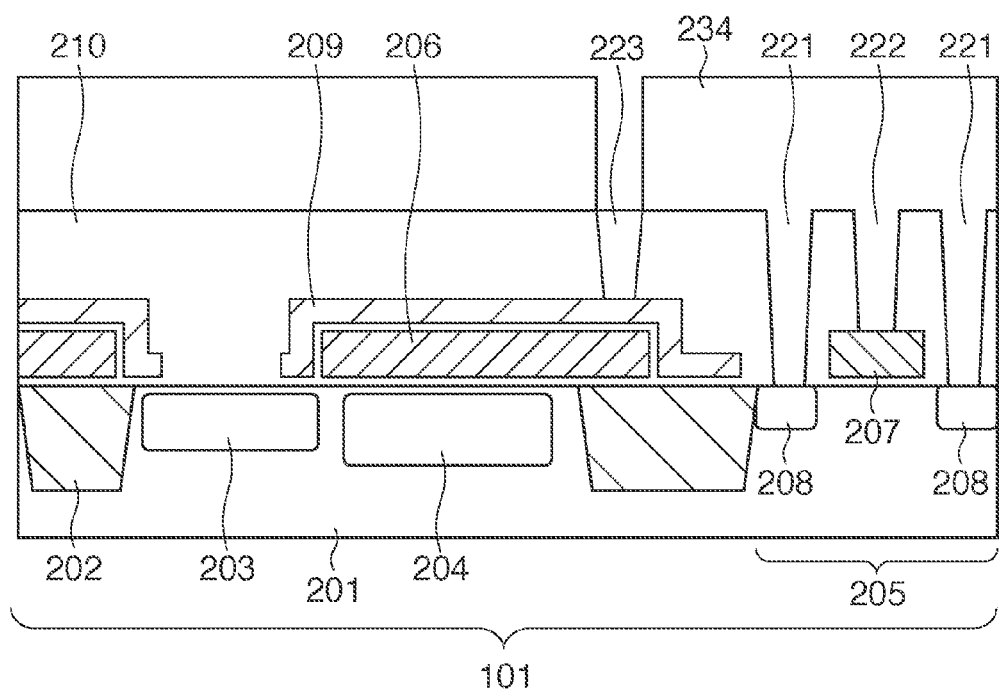
FIGS. 6A and 6B are sectional views showing a method of manufacturing a photoelectric conversion device according to the fourth embodiment.

As shown in FIG. 6A, a gate electrode contact hole 222 and diffusion layer contact holes 221 are formed, and then a resist mask 234 for forming a light-shielding film contact hole 223 is formed. At this time, the pattern of the resist mask 234 is formed to cover the gate electrode contact hole 222 and diffusion layer contact holes 221. After forming a light-shielding film contact hole 223, the resist mask 234 is removed.

Figure 6B:
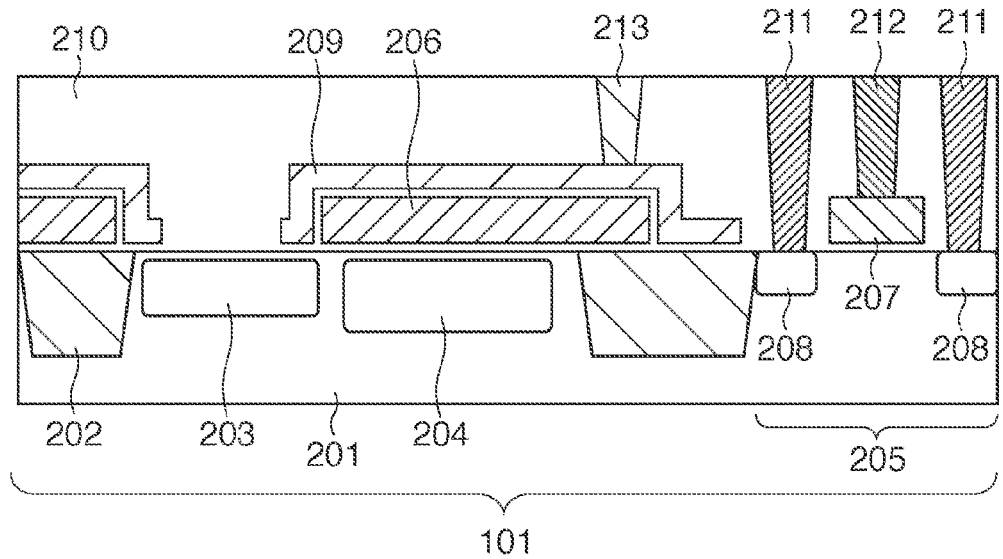

A metal film is deposited by CVD or the like, and an unnecessary metal film is removed by CMP or the like, forming contact plugs (FIG. 6B). Finally, a wiring layer 214 is formed from a metal such as aluminum or copper (FIG. 4).

The fourth embodiment can shorten the process because contact plugs are formed at once, in addition to the same effects as those in the third embodiment. In the fourth embodiment, when forming the light-shielding film contact hole 223, the gate electrode contact hole 222 and diffusion layer contact holes 221 are filled by applying a mask material such as a resist mask. This can prevent contamination of the photodiode with a metal from the light-shielding film. Thus, a dark current and point defects can be reduced.

In the fourth embodiment, the gate electrode contact hole 222 and diffusion layer contact holes 221 of a MOS transistor 205 are formed first. Instead, the light-shielding film contact hole 223 may be formed first. In this case, the same effects as those described above can be attained by filling the light-shielding film contact hole 223 with the resist mask 234 prior to forming the gate electrode contact hole 222 and diffusion layer contact holes 221.

In the third and fourth embodiments, the gate electrode contact hole 222 and diffusion layer contact holes 221 are formed in addition to the light-shielding film contact hole 223. However, the present invention is not limited to this and is also applicable to a case in which a contact hole is formed on a metal film (or metal silicide film), in addition to the light-shielding film contact hole 223.

Fifth Embodiment

A method of manufacturing a photoelectric conversion device in the fifth embodiment will be explained with reference to FIGS. 7A to 7D. The fifth embodiment is directed to a method of manufacturing a CMOS photoelectric conversion device, similar to the first and second embodiments. In the manufacturing method of the fifth embodiment, a high melting point metal compound layer is arranged even in the pixel region.

Figure 7A:
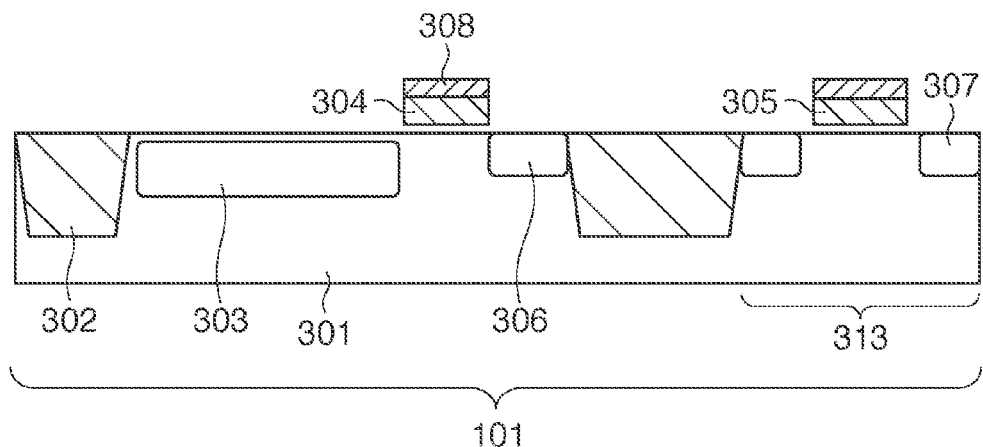
FIGS. 7A to 7D are sectional views showing a method of manufacturing a photoelectric conversion device according to a fifth embodiment.

As shown in FIG. 7A, the photoelectric conversion device includes, in a semiconductor substrate 301 in a pixel region 101, a photoelectric conversion unit 303 which performs photoelectric conversion, and a floating diffusion 306. The photoelectric conversion device further includes a gate electrode 304 of a transfer MOS transistor which transfers charges from the photoelectric conversion unit 303 to the floating diffusion 306, element isolations 302, and a MOS transistor 313 arranged in a region isolated by the element isolations. The MOS transistor 313 includes a gate electrode 305 and source/drain regions 307. The MOS transistor 313 is one which builds the pixel of a CMOS photoelectric conversion device, such as a reset MOS transistor for resetting the potential of the floating diffusion 306.

The structure in FIG. 7A is fabricated by a general semiconductor process, similar to the first to fourth embodiments. More specifically, element isolations 302 are formed in a silicon semiconductor substrate 301 by STI or LOCOS. A photoelectric conversion unit 303, well (not shown) in the peripheral circuit region, and the like are sequentially formed by impurity doping. Then, the gate electrodes of MOS transistors are formed in the pixel region and peripheral circuit region. In FIG. 7A, gate electrodes 304 and 305 are formed. The gate electrode is formed by depositing a polysilicon film and patterning it using photolithography and etching. Thereafter, the source/drain regions of the MOS transistor are formed by impurity doping. In FIG. 7A, source/drain regions 307 are formed. At this time, a MOS transistor having the LDD structure may be formed to improve the MOS transistor performance. More specifically, the source/drain regions 307 may be formed after forming side walls. Also, after forming the gate electrode 304, the photoelectric conversion unit 303 can be formed by doping an impurity in self-alignment using the gate electrode 304.

In FIG. 7A, a high melting point metal silicide layer 308 is formed on the gate electrodes 304 and 305. When forming the silicide layer, first, a semiconductor compound blocking layer (not shown) for a high melting point metal is formed from a semiconductor compound such as a silicon nitride film, silicon oxide film, or silicon oxynitride film. The semiconductor compound blocking layer is left only in a desired region, for example, on the diffusion layer, and is selectively removed from the remaining region. Then, a multilayered film of a high melting point metal film of cobalt and an antioxidant film of the high melting point metal of titanium nitride is deposited by CVD, sputtering, or the like. The multilayered film is annealed to cause silicon, which forms the gate electrode of the transistor, to react with the high melting point metal (silicidation), thereby forming a silicide layer. The multilayered film containing an unreacted high melting point metal is removed, obtaining the structure in FIG. 7A.

Examples of the semiconductor compound of the high melting point metal are titanium silicide, nickel silicide, cobalt silicide, tungsten silicide, molybdenum silicide, tantalum silicide, chrome silicide, palladium silicide, and platinum silicide. Other materials of the antioxidant film for the high melting point metal are nickel and titanium.

Figure 7B:
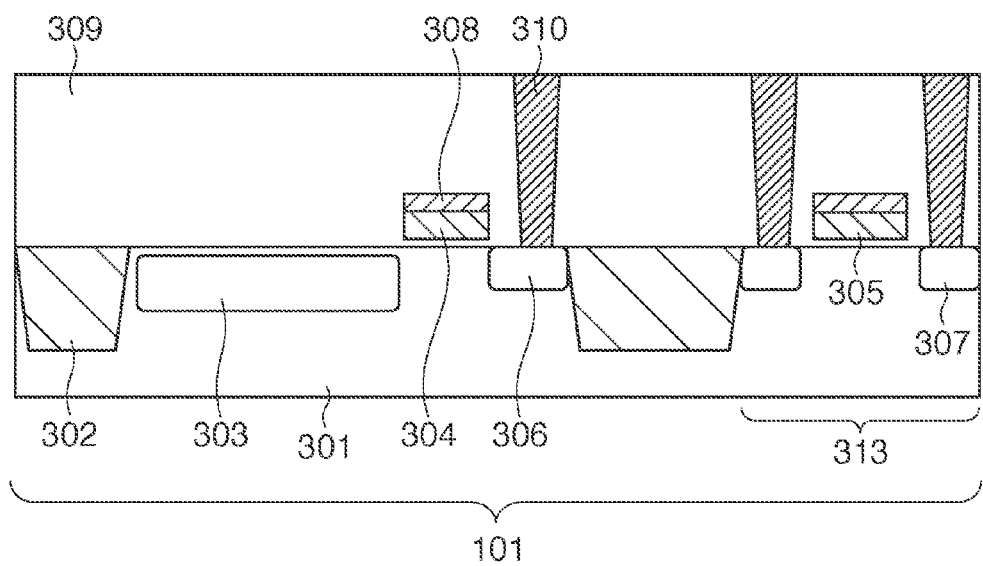
Figure 7C:
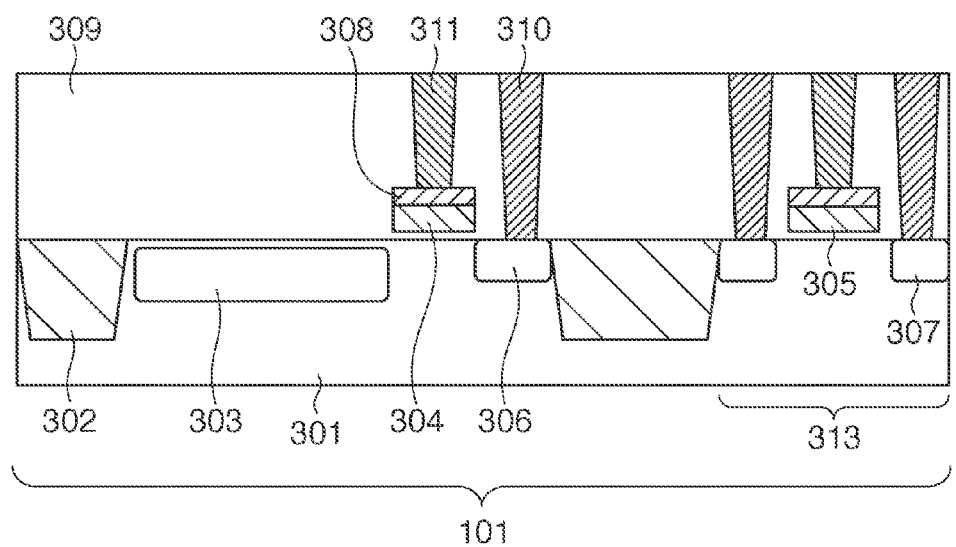

As shown in FIG. 7B, an insulating layer 309 serving as an interlayer dielectric film is formed from a silicon oxide film or a boron- or phosphorous-containing silicon oxide film. Thereafter, contacts are formed. First, only contact holes for contact (diffusion layer contact) plugs 310 to be connected to diffusion layers other than the gate electrode having the high melting point metal silicide layer are formed by etching. Then, a metal film is deposited by CVD or the like, and an unnecessary metal film is removed by CMP or the like, forming contact plugs 310 on the diffusion layers. The metal film may be a single- or multi-layered film. Before forming the contact plugs 310, an impurity may be doped into a desired contact hole to form an impurity region, which can stabilize the contact resistance. After forming the contact holes, their bottoms may be cleaned with an acid or alkali solution such as hydrofluoric acid or ammonia hydrogen peroxide mixture before forming contact plugs.

After that, a contact (gate electrode contact) plug 311 is formed on the gate electrode having the high melting point metal silicide layer. A contact hole is formed by the same method as that of the diffusion layer contact plugs 310, and a contact plug is formed, obtaining the structure in FIG. 7C.

Figure 7D:
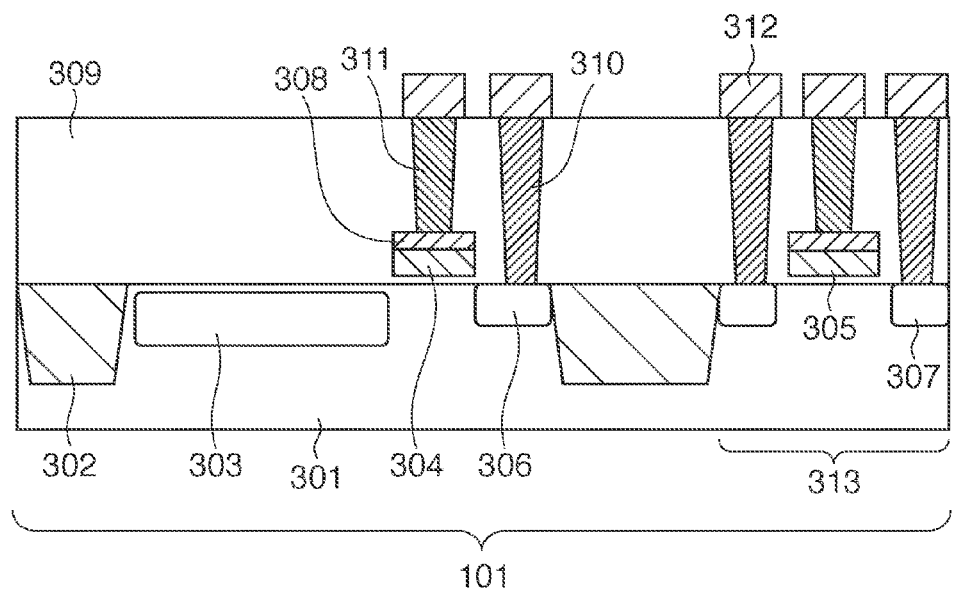

Finally, a wiring layer 312 is formed from a metal such as aluminum or copper, forming the structure in FIG. 7D. Further, a wiring layer, insulating layer, and via plug are formed. Arbitrary elements such as a color filter and microlens are formed, completing a photoelectric conversion device.

In the manufacturing method of the fifth embodiment, contamination of the photoelectric conversion unit with a high melting point metal from the high melting point metal compound layer can be prevented in the photoelectric conversion device having the high melting point metal compound layer, similar to the first and second embodiments. A dark current and point defects can therefore be reduced.

Note that the high melting point metal silicide layer 308 can be formed on the gate electrode not only by the foregoing manufacturing method, but also by depositing a high melting point metal silicide layer, for example, a tungsten silicide layer by sputtering or the like subsequently to deposition of a polysilicon film serving as a gate electrode, and then patterning the deposited film using photolithography and etching.

As described above, the present invention relates to a method of manufacturing a structure having a member such as a high melting point metal compound layer (silicide layer) or light-shielding film, that is, a member which may generate a leakage current if it contaminates a diffusion layer. A contact hole through which a diffusion layer is exposed at a portion having no member such as a high melting point metal compound layer or light-shielding film, and a contact hole through which a high melting point metal compound layer or light-shielding film is exposed at a portion having a member such as a high melting point metal compound layer or light-shielding film are formed in different steps. After forming a contact plug in the contact hole formed first, a contact hole to be formed later is formed. This can reduce contamination with a metal from the high melting point metal compound layer or light-shielding film. The first to fifth embodiments have exemplified the high melting point metal compound layer and light-shielding film. However, the present invention is not limited to them and is applicable to a structure having a member which may generate a leakage current if it contaminates in a diffusion layer.

The first to fifth embodiments can be appropriately combined. The first to fifth embodiments have described a CMOS photoelectric conversion device, but the type of photoelectric conversion device is not limited to this.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2009-152873, 2009-152875, both filed on Jun. 26, 2009 and 2010-115746, filed May 19, 2010, which are hereby incorporated by reference herein in their entirety.

What is claimed is:

1. A method of manufacturing a photoelectric conversion device, the method comprising:
   a providing step of providing a substrate including a pixel region and a peripheral circuit region, wherein a diffusion layer is arranged in the pixel region, a member containing metal is arranged in at least one of the pixel region and the peripheral circuit region, and the diffusion layer and the member are covered with an insulating layer;
   a first step that includes forming a first contact hole in the insulating layer to expose the diffusion layer;
   a second step that includes forming a second contact hole in the insulating layer to expose the member; and
   a doping step of doping an impurity into the diffusion layer via the first contact hole,
   wherein the method satisfies one of conditions (1) and (2):
   (1) the second step is performed in a state where the first contact hole is filled; and
   (2) the first step is performed after the second step.

2. The method according to claim 1, wherein, in the condition (1), the doping step is performed before the second step, and, in the condition (2), the doping step is performed in a state where the second contact hole is filled.

3. The method according to claim 1, further comprising a third step that includes forming a first contact plug in the first contact hole to connect with the diffusion layer, and forming a second contact plug in the second contact hole to connect with the member after both of the first and second steps.

4. The method according to claim 1, wherein, in the condition (1), the first contact hole is filled with metal, and, in the condition (2), the first step is executed in a state where the second contact hole is filled with metal.

5. The method according to claim 1, wherein, in the condition (1), the first contact hole is filled with photoresist, and, in the condition (2), the first step is performed in a state where the second contact hole is filled with photoresist.

6. The method according to claim 1, wherein the method satisfies the condition (1).

7. The method according to claim 1, further comprising a cleaning step of cleaning an inside of the first contact hole with an acid solution or an alkali solution.

8. The method according to claim 7, wherein the cleaning step is performed after the doping step.

9. The method according to claim 1, wherein the member is made of at least one silicide selected from a group consisting of titanium silicide, nickel silicide, cobalt silicide, tungsten silicide, molybdenum silicide, tantalum silicide, chrome silicide, palladium silicide, and platinum silicide.

10. The method according to claim 1, wherein a first MOS transistor is arranged in the pixel region, the diffusion layer forms part of the first MOS transistor, a second MOS transistor is arranged in the peripheral circuit region, and the member is disposed on at least one of a gate electrode and a diffusion layer of the second MOS transistor.

11. The method according to claim 1, wherein, in the providing step, an insulating film layer is arranged between the diffusion layer and the insulating layer, and the insulating film layer does not extend between the member and the insulating layer.

12. A method of manufacturing a photoelectric conversion device, the method comprising:
   a providing step of providing a substrate including a pixel region and a peripheral circuit region, wherein a diffusion layer is arranged in the pixel region, a member containing metal is arranged in at least one of the pixel region and the peripheral circuit region, and the diffusion layer and the member are covered with an insulating layer;
   a first step that includes forming a first contact hole in the insulating layer to expose the diffusion layer and forming a first contact plug in the first contact hole to connect with the diffusion layer; and
   a second step that includes forming a second contact hole in the insulating layer to expose the member and forming a second contact plug in the second contact hole to connect with the member,
   wherein the first step and the second step are performed at different times.

13. The method according to claim 12, wherein the second step is performed after the first step.

14. The method according to claim 12, wherein the first step includes at least one of: doping an impurity into the diffusion layer via the first contact hole, and cleaning an inside of the first contact hole with an acid solution or an alkali solution.

15. The method according to claim 12, wherein the member is made of at least one silicide selected from a group consisting of titanium silicide, nickel silicide, cobalt silicide, tungsten silicide, molybdenum silicide, tantalum silicide, chrome silicide, palladium silicide, and platinum silicide.

16. The method according to claim 12, wherein a first MOS transistor is arranged in the pixel region, the diffusion layer forms part of the first MOS transistor, a second MOS transistor is arranged in the peripheral circuit region, and the member is disposed on at least one of a gate electrode and a diffusion layer of the second MOS transistor.

17. The method according to claim 12, wherein, in the providing step, an insulating film layer is arranged between the diffusion layer and the insulating layer, and the insulating film layer does not extend between the member and the insulating layer.

18. A method of manufacturing a semiconductor device, the method comprising:
   a providing step of providing a substrate having a diffusion layer and a member that contains metal, the diffusion layer and the member being covered with an insulating layer;
   a first step that includes forming a first contact hole in the insulating layer to expose the diffusion layer;
   a second step that includes forming a second contact hole in the insulating layer to expose the member; and
   a doping step of doping an impurity into the diffusion layer via the first contact hole,
   wherein the method satisfies one of conditions (1) and (2):
   (1) the second step is performed in a state where the first contact hole is filled; and
   (2) the first step is performed after the second step.

19. The method according to claim 18, further comprising a third step that includes forming a first contact plug in the first contact hole to connect with the diffusion layer, and forming a second contact plug in the second contact hole to connect with the member, after both of the first and second steps.

20. A method of manufacturing a semiconductor device, the method comprising:
- a providing step of providing a substrate having a diffusion layer and a member that contains metal, the diffusion layer and the member being covered with an insulating layer;
- a first step that includes forming a first contact hole in the insulating layer to expose the diffusion layer, and forming a first contact plug in the first contact hole to connect with the diffusion layer; and
- a second step that includes forming a second contact hole in the insulating layer to expose the member, and forming a second contact plug in the second contact hole to connect with the member,
- wherein the first step and the second step are performed at different times.

21. The method according to claim 20, wherein the first step includes at least one of: doping an impurity into the diffusion layer via the first contact hole, and cleaning an inside of the first contact hole with an acid solution or an alkali solution, wherein the second step is performed after the first step.

22. A method of manufacturing a photoelectric conversion device, the method comprising:
- a providing step of providing a substrate including a pixel region and a peripheral circuit region, wherein a diffusion layer is arranged in the pixel region, a member containing metal is arranged in at least one of the pixel region and the peripheral circuit region, and the diffusion layer and the member are covered with an insulating layer;
- a first step that includes forming a first contact hole in the insulating layer to expose the diffusion layer, and doping an impurity into the diffusion layer via the first contact hole;
- a second step that includes forming a second contact hole in the insulating layer to expose the member; and
- a third step that includes forming a first contact plug in the first contact hole to connect with the diffusion layer, and forming a second contact plug in the second contact hole to connect with the member after both of the first and second steps,
- wherein the method satisfies one of conditions (1) and (2):
  - (1) the second step is performed in a state where the first contact hole is covered with photoresist; and
  - (2) the first step is performed in a state where the second contact hole is covered with photoresist.

23. The method according to claim 22, further comprising a cleaning step of cleaning an inside of the first contact hole with an acid solution or an alkali solution after the first step.

24. The method according to claim 22, wherein the method satisfies the condition (1).

25. The method according to claim 22, wherein the member is made of at least one silicide selected from a group consisting of titanium silicide, nickel silicide, cobalt silicide, tungsten silicide, molybdenum silicide, tantalum silicide, chrome silicide, palladium silicide, and platinum silicide.

26. The method according to claim 22, wherein a first MOS transistor is arranged in the pixel region, the diffusion layer forms part of the first MOS transistor, a second MOS transistor is arranged in the peripheral circuit region, and the member is disposed on at least one of a gate electrode and a diffusion layer of the second MOS transistor.

27. The method according to claim 22, wherein, in the providing step, an insulating film layer is arranged between the diffusion layer and the insulating layer, and the insulating film layer does not extend between the member and the insulating layer.

* * * * *